(12) United States Patent
Liu et al.

(10) Patent No.: US 8,598,965 B2
(45) Date of Patent: Dec. 3, 2013

(54) ATTENUATOR

(75) Inventors: Mao-Chen Liu, Nantou (TW); Chia-Hua Ho, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 444 days.

(21) Appl. No.: 13/051,111

(22) Filed: Mar. 18, 2011

(65) Prior Publication Data
US 2012/0154076 A1 Jun. 21, 2012

(30) Foreign Application Priority Data
Dec. 16, 2010 (TW) ................................ 99144135 A

(51) Int. Cl.
*H01P 1/22* (2006.01)
(52) U.S. Cl.
USPC ....................................................... 333/81 R

(58) Field of Classification Search
USPC ............................ 333/81 A, 81 R, 81 B, 22 R
See application file for complete search history.

(56) References Cited

U.S. PATENT DOCUMENTS 8,319,579 B2 * 11/2012 Zhuang et al. .............. 333/28 R

* cited by examiner

*Primary Examiner* — Stephen Jones
(74) *Attorney, Agent, or Firm* — Birch, Stewart, Kolasch & Birch, LLP

(57) ABSTRACT

An attenuator is provided. The attenuator includes a first resistor, which is electrically connected to an input node; a nanowire, which is connected to the first resistor in series, for filtering low frequency signal; a second resistor, having an output node, which is electrically connected to the nanowire; wherein when a low frequency voltage is received by the input node, the nanowire filters the low frequency voltage such that the output node generates an output voltage lower than the low frequency voltage.

4 Claims, 2 Drawing Sheets

ATTENUATOR

FIELD OF THE INVENTION

The present invention relates to an attenuator, and it specifically relates to the nanowire attenuator.

BACKGROUND OF THE INVENTION

The current attenuator or filter includes three types, namely, active type, passive type and digital type. Passive filter is formed by resistor, capacitor and inductor. The passive filter must consider the quality factor of inductor and capacitor, but in CMOS process, the quality factor of the inductor is generally not good, which results in its bad performance. In the active filter, in addition to using resistor, capacitor and inductor, we also use transistor or operation amplifier for signal amplification after filtering. Therefore, noise can be filtered out and the gain can be amplified. However, active filter must use extra bias, which increases the power consumption of the chip itself. In addition, in CMOS process, resistor, capacitor and inductor occupies a too large area, which could easily be interfered by noise. Even the transistor and amplifier also occupy some area. However, in digital filter, software is used for filtering way. It has advantage of small volume and less power consumption. But the disadvantages are, it is not in real time, and it takes some time to display the result. In addition, when digital filter is used, analog to digital conversion needs to be done first, then after the filtering, digital to analog conversion needs to be done again, which could easily lead to the distortion of the signal.

Based on the above factor, it is necessary to develop an attenuator that does not need analog to digital conversion, does not need extra power, of low power consumption, and occupies smaller area.

SUMMARY OF THE INVENTION

The embodiment in this disclosure provides an attenuator, which includes: a first resistor, which is electrically connected to an input node; a nanowire, which is serially connected to the first resistor to filter out the low frequency signal; a second resistor, which contains an output node that is serially connected to the nanowire; wherein, when that input node receives the low frequency signal, the nanowire filters out the low frequency voltage so that the output node will generate an output voltage that is lower than the low frequency voltage.

The above attenuator uses nanowire to achieve the purpose of attenuating low frequency signal, and there is no need of extra bias and there is no need for the implementation of digital to analogue conversion. For the advantages and spirit regarding the present invention, further understanding can be achieved through the following detailed description and attached drawings of the present invention.

DETAILED DESCRIPTION OF THE INVENTION

In the following disclosure, many different embodiments or examples are provided for the embodiment of features of different disclosures. The key elements and arrangement description of special examples are as in the followings to simplify this disclosure. Of course, it is example only instead of limitation. In addition, among all examples, this disclosure might have repeatedly referred to number and/or character. Repetition is for simplification and clarity objective instead of the description of the relationship and/or configuration among all kinds of embodiments.

Figure 1:
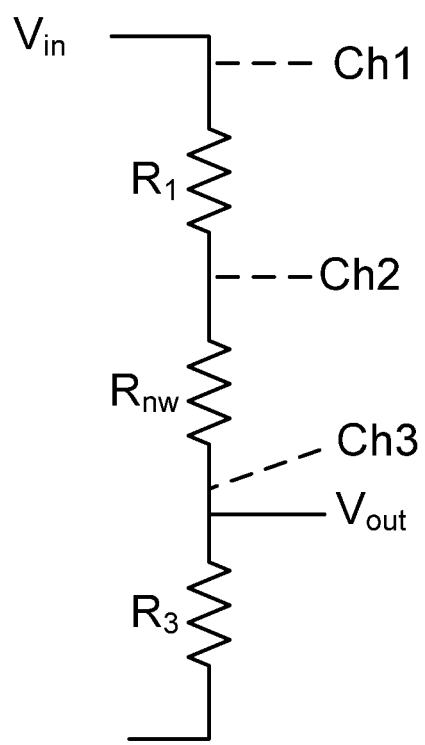
FIG. 1 is a circuit diagram, which shows the attenuator in the example.

FIG. 1 is an electronic circuit diagram, which shows the attenuator of the example. Attenuator 100 includes a first resistor R1, a nanowire RNW and a second resistor R2. The first resistor R1 is electrically connected to an input node Vin. Nanowire RNW is serially connected to first resistor R1. Nanowire RNW at low frequency has high impedance, and at high frequency, has low impedance, hence, it can be used to filter out low frequency signal. Second resistor R2 possesses an output node Vout, which is serially connected to nanowire RNW. When input node Vin receives low frequency voltage, nanowire will filter out low frequency voltage so that output node Vout will generate an output voltage that is much lower than the low frequency input voltage. As the frequency of low frequency input voltage gets lower, the output voltage will get smaller. This is because nanowire RNW attenuates low frequency input voltage.

When input node Vin receives high frequency voltage, nanowire RNW will not filter out high frequency voltage, hence, output node Vout will generate output voltage similar to high frequency voltage. That is, the higher the frequency of high frequency input voltage, the closer the output voltage to the high frequency output voltage. This is because high frequency input voltage is not attenuated. In the current embodiment, when nanowire RNW is operated in, for example, frequency above 80 Hz, it will start to display a state approaching the lowest impedance, but it is not limited to this.

FIG. 2a-2d is waveform diagram. It shows the change of input voltage versus output voltage for attenuator of the example at different frequencies. According to the circuit diagram of FIG. 1, the signal from signal generator is connected to input node Vin of FIG. 1. Then oscilloscope is used to measure respectively the voltage waveforms of terminals Ch1, Ch2 and Ch3 (that is, output node Vout).

Figure 2A:
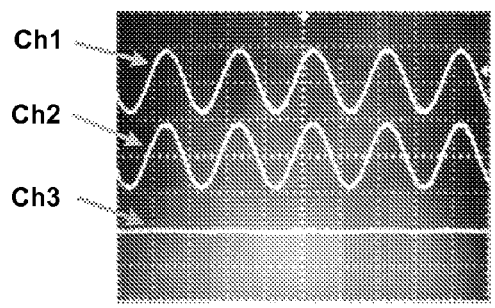
FIG. 2a-2d is a waveform diagram, which shows the change of input voltage versus output voltage for the attenuator of the example at different frequencies.
Figure 2B:
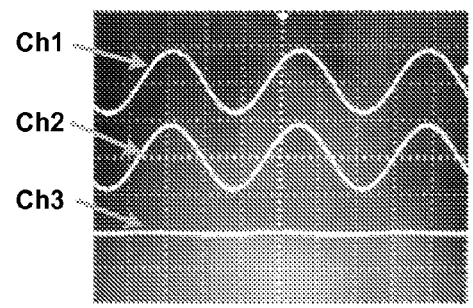

FIG. 2a shows the voltage waveforms measured at terminals Ch1, Ch2 and Ch3 by oscilloscope when signal of amplitude 1 volt and frequency 20 Hz is sent out by signal generator. It can be observed that the output voltage of output node Vout is much smaller the voltage of terminal Ch3. FIG. 2b shows the voltage waveforms measured at terminals Ch1, Ch2 and Ch3 by oscilloscope when signal of amplitude 1 volt and frequency 60 Hz is sent out by signal generator. Similarly, it can be observed that the output voltage of output node Vout is much smaller than the voltage of terminal Ch3.

Figure 2C:
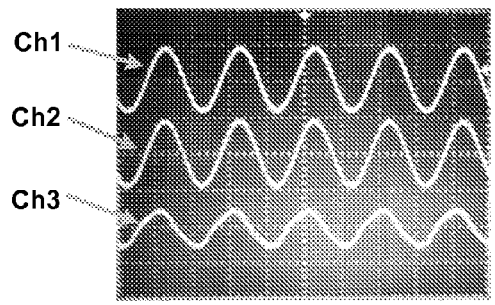
Figure 2D:
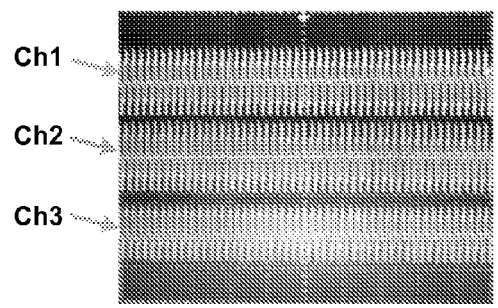

FIG. 2c shows the voltage waveforms measured at terminals Ch1, Ch2 and Ch3 by oscilloscope when signal of amplitude 1 volt and frequency 2 kHz is sent out by signal generator. FIG. 2d shows the voltage waveforms measured at terminals Ch1, Ch2 and Ch3 by oscilloscope when signal of amplitude 1 volt and frequency 20 kHz is sent out by signal generator. It can be observed that when frequency becomes higher, the voltage of output node Vout is the voltage output of input voltage after it is voltage-divided.

Although the present invention is disclosed through a better embodiment as above, yet it is not used to limit the present invention, anyone that is familiar with this art, without deviating the spirit and scope of the present invention, can make any kinds of change, revision and finishing; therefore, the protection scope of the present invention should be based on the scope as defined by the following attached "what is claimed".

What is claimed is:

1. An attenuator, comprising:
   a first resistor electrically coupled to an input node for receiving an input signal;
   a nanowire connected to the first resistor in series for filtering out a low frequency signal; and
   a second resistor connected to the nanowire in series and comprising an output node,
   wherein when the input signal is a low frequency voltage, the nanowire filters out the low frequency voltage so that the output node will provide an output voltage which is lower than the low frequency voltage.

2. The attenuator of claim 1, wherein when the input node receives a high frequency voltage, the nanowire will not filter out the high frequency so that the output node will provide an output voltage that is similar to the high frequency voltage.

3. The attenuator of claim 1, wherein when the frequency of the low frequency voltage becomes lower, the output voltage will become smaller.

4. The attenuator of claim 1, wherein the nanowire will enter a high impedance state when the input signal has a low frequency, and will enter a low impedance state when the input signal has a high frequency.

* * * * *